United States Patent [19]

Hsia et al.

[11] Patent Number: 5,907,249
[45] Date of Patent: May 25, 1999

[54] VOLTAGE TOLERANT INPUT/OUTPUT BUFFER

[75] Inventors: Yuwen Hsia, San Jose; Sarathy Sribhashyam, Sunnyvale, both of Calif.

[73] Assignee: S3 Incorporated, Santa Clara, Calif.

[21] Appl. No.: 08/801,002

[22] Filed: Feb. 19, 1997

[51] Int. Cl.⁶ .............................................. H03K 19/0185
[52] U.S. Cl. ................................ 326/81; 326/27; 326/86
[58] Field of Search .................... 326/80, 81, 57–58, 326/121, 27, 17, 86

[56] References Cited

U.S. PATENT DOCUMENTS

| | | | |
|---|---|---|---|
| 5,023,488 | 6/1991 | Gunning | 307/475 |
| 5,381,062 | 1/1995 | Morris | 326/28 |
| 5,424,659 | 6/1995 | Stephen et al. | 362/81 |
| 5,512,844 | 4/1996 | Nakakura et al. | 326/81 |
| 5,576,635 | 11/1996 | Partovi et al. | 326/27 |
| 5,635,861 | 6/1997 | Chan et al. | 326/81 |

OTHER PUBLICATIONS

Brian Henderson and Laszlo Gal, 5 V Compatibility With 3.3 V–Only CMOS ASICs, *Microelectronics Journal*, vol. 23, No. 8, 1992, (pp. 577–580).

Nora Maene, et al., On Chip Electrostatic Discharge Protections For Inputs, Outputs and Supplies of CMOS Circuits; *EOS/ESD Symposium 92–231*, date unknown, (pp. 5B.1.1–5B.1.6).

Marcel J. M. Pelgrom and E. Carel Dijkmans, A ⅗V Compatible I/O Buffer; *IEEE Journal of Solid–State Circuits*, vol. 30, No. 7, Jul. 7, 1995, (pp. 823–825).

Makoto Takahashi, et al. 3.3V–5V Compatible I/O Circuit Without Thick Gate Oxide, *IEEE 1992 Custom Integrated Circuits Conference*, 1992, (pp. 23.3.1–23.3.4).

Steven H. Voldman, ESD Protection in a Mixed Voltage Interface and Multi–Rail Disconnected Power Grid Environment in 0.50– and 0.25 μm Channel Length CMOS Technologies, *EOS/ESD Symposium 94–125*, date unknown, (pp. 3.4.1–3.4.10).

*Primary Examiner*—Jon Santamauro
*Assistant Examiner*—Don Phu Le
*Attorney, Agent, or Firm*—Fenwick & West LLP

[57] ABSTRACT

A voltage tolerant input/output buffer comprises a current mirror, a voltage sensing and isolating circuit, an output pull-up transistor, and an output pull-down transistor. The output pull-up transistor preferably has its gate coupled to the voltage sensing and isolating circuit to receive signals from the lower voltage circuitry, its source coupled to the supply voltage for the lower operating voltage circuitry, and its drain provides the output for connection to the higher voltage circuitry. The voltage sensing and isolating circuit is coupled between the gate and the drain of the output pull-up transistor. The current mirror is coupled to ground and to the voltage sensing and isolating circuit. The output pull-down transistor has its drain coupled to the voltage sensing and isolating circuit, it source coupled to ground, and its gate coupled to receive pull down signals from the lower operating voltage circuit. The current mirror and the voltage sensing and isolating circuit are provided such that as the higher voltage circuit applies a high supply voltage to the drain of the pull-up output transistor, the pull-up output transistor is able to transition to a state at the supply voltage of the lower circuit and sink the current such that the buffer operates properly and correctly, unaffected by the application of the higher operating supply voltage to the drain of the pull-up transistor.

5 Claims, 3 Drawing Sheets

[5,907,249]

VOLTAGE TOLERANT INPUT/OUTPUT BUFFER

BACKGROUND OF THE INVENTION

1. Field of the Invention.

The present invention relates generally to and transistors and circuits made using transistors. In particular, the present invention relates to input/output (I/O) buffers made using metal-oxide-semiconductor field-effect transistors (MOSFETs). Still more particularly, the present invention relates to an input/output buffer that can be coupled to circuits having a higher operating voltage level without affecting the performance of the input/output buffer.

2. Description of the Background Art.

In the area of semiconductors, there is a continuing need for integrated circuits that have more transistors, thereby allowing more complicated and elaborate circuitry to be created on a single chip and enabling the chip to provide even greater functionality and computational power than is presently available. There is also a need to have integrated circuits consume less power since the number of transistors included within an integrated circuit is ever increasing. Furthermore, there is a need for increased switching speeds for the transistors since the operational clock speeds of integrated circuits are also ever increasing. These competing needs have caused the generation of mixed voltage integrated circuits where different portions of the circuits have different operating voltages and are created with different processes. For example, present day integrated circuits include mixed voltage scenarios having higher voltage portions operating at five (5) volts and created with a five volt (5 V) process, and lower voltage portions operating at three (3) volts and created with a three volt (3 V) process.

One problem with such mixed voltage integrated circuits is connecting portions of the circuit having different operating voltages. The differential in operating voltages causes device failure and inaccurate operation in the transistors connecting ("connecting transistors") the lower voltage portions to the higher voltage portions because of the increased stress placed on the connecting transistors designed for operation at the lower voltage. Typically, the semiconductor fabrication process used to create the lower voltage portions, for example a 3 V process creates devices using thinner layers of semiconductor materials than those used the fabrication process to create the higher voltage portions of the integrated circuit. The process migration has been driven by the desire for improved performance with circuits that consume less power, have greater switching speeds and require less materials to manufacture because the wells of the transistors are more shallow and the gate oxide thicknesses are reduced. The difference in thickness used in these processes affects the leakage current of transistors and in turn the overall reliability of mixed voltage circuits. A 5 V voltage difference between gate-drain, gate-source or source-drain can cause sufficient degradation in the performance of the transistors, especially in 3 V process transistors.

One prior art approach used to reduce the instances of device failure for connecting transistors has been to increase the thickness of some of the low operating voltage portions of the integrated circuit, specifically the connecting transistors. For example, the prior art has used a "dual oxide" for core areas where the lower operating voltage portions of the integrated circuit interface with the higher perating voltage portions of the integrated circuit. Use of "dual oxide" especially for the gate oxide reduces the reliability problems of the connecting transistors, however, the use of dual oxide creates other problems. In particular, the use of dual oxide makes the manufacturing process more difficult by adding undesirable levels of complexity and cost. Furthermore, the use of dual oxide changes the threshold voltages of the transistors and also degrades the switching speed of the connecting transistors, and creates a bottleneck limiting the rate at which data can be transmitted from in and out of the integrated circuit.

Yet another prior art approach used reduce the instances of device failure for connecting transistors is the use of a floating well as part of the connecting transitors. A transistor with a floating well is a MOSFET transistor having a well that switches between being coupled to a higher operating voltage (i.e., 5 volts) and a lower operating voltage (i.e., 3 volts). The switching between voltages is triggered by the charge and discharge of the well once the higher operating voltage is applied to and removed from the transistor. However, the problem with the use of floating wells is that it is difficult to predict the charging and discharging times for particular wells. Furthermore, the charging and discharging times are highly dependent on the layout pattern and operation of the circuit.

Therefore, there is a continuing need for an input/output buffer that can be used a mixed voltage circuit without the device failure of the prior art. Such an input/output buffer must be easy to manufacture and not suffer from switching speed delays.

SUMMARY OF THE INVENTION

The present invention overcomes the deficiencies and limitations of the prior art with a voltage tolerant input/output buffer. The preferred embodiment of the voltage tolerant input/output buffer advantageously eliminates the aforementioned reliability problems, and does not require additional semiconductor processes for manufacture. The voltage tolerant input/output buffer advantageously uses design techniques to make the input/output buffer tolerant to higher operating voltages and capable of operation at such higher voltages without device failure. A preferred embodiment of the voltage tolerant input/output buffer preferably comprises a current mirror, a voltage sensing and isolating circuit, an output pull-up transistor, and an output pull-down transistor. The output pull-up transistor preferably has its gate coupled to the voltage sensing and isolating circuit and also receives signals from the lower voltage circuitry (core), its source coupled to the supply voltage for the lower operating voltage circuitry, and its drain provides the output for connection to the higher voltage circuitry. The output pull-up transistor preferably has its well coupled to the supply voltage for the higher operating voltage circuitry. The voltage sensing and isolating circuit is coupled between the gate and the drain of the output pull-up transistor. The current mirror is coupled to ground and to the voltage sensing and isolating circuit. The output pull-down transistor has its drain coupled to the voltage sensing and isolating circuit, it source coupled to ground, and its gate coupled to receive pull-down signals from the lower operating voltage circuit (core). This coupling of the well pin of the pull-up output transistor, the current mirror, and the voltage sensing and isolating circuit are provided such that as the higher voltage circuit applies a high supply voltage to the drain of the pull-up output transistor, the voltage sensing and isolating circuit pulls up the gate voltage of the pull-up output transistor to the high supply voltage thereby turning off the pull-up output transistor, and the application of the high supply voltage to well of the pull-up output transistor prevents current flow between the drain and well. Hence, the pull-up transistor operates unaffected by the application of the higher operating supply voltage to the drain of the pull-up transistor. The present invention also maintains the leakage currents to and from the output pad as small as possible.

DETAILED DESCRIPTION OF THE PREFERRED EMBODIMENTS

While the present invention will now be described in terms of a 3 V input/output buffer made for operating at a lower voltage of 3 V and constructed using 3 V process technology such that it is tolerant of a higher operating voltage of a 5 V supply voltage, those skilled in the art will realize that the present invention applies to other mixed voltage scenarios other than the particular mixed operating voltage of 3 V and 5 V.

Figure 1:
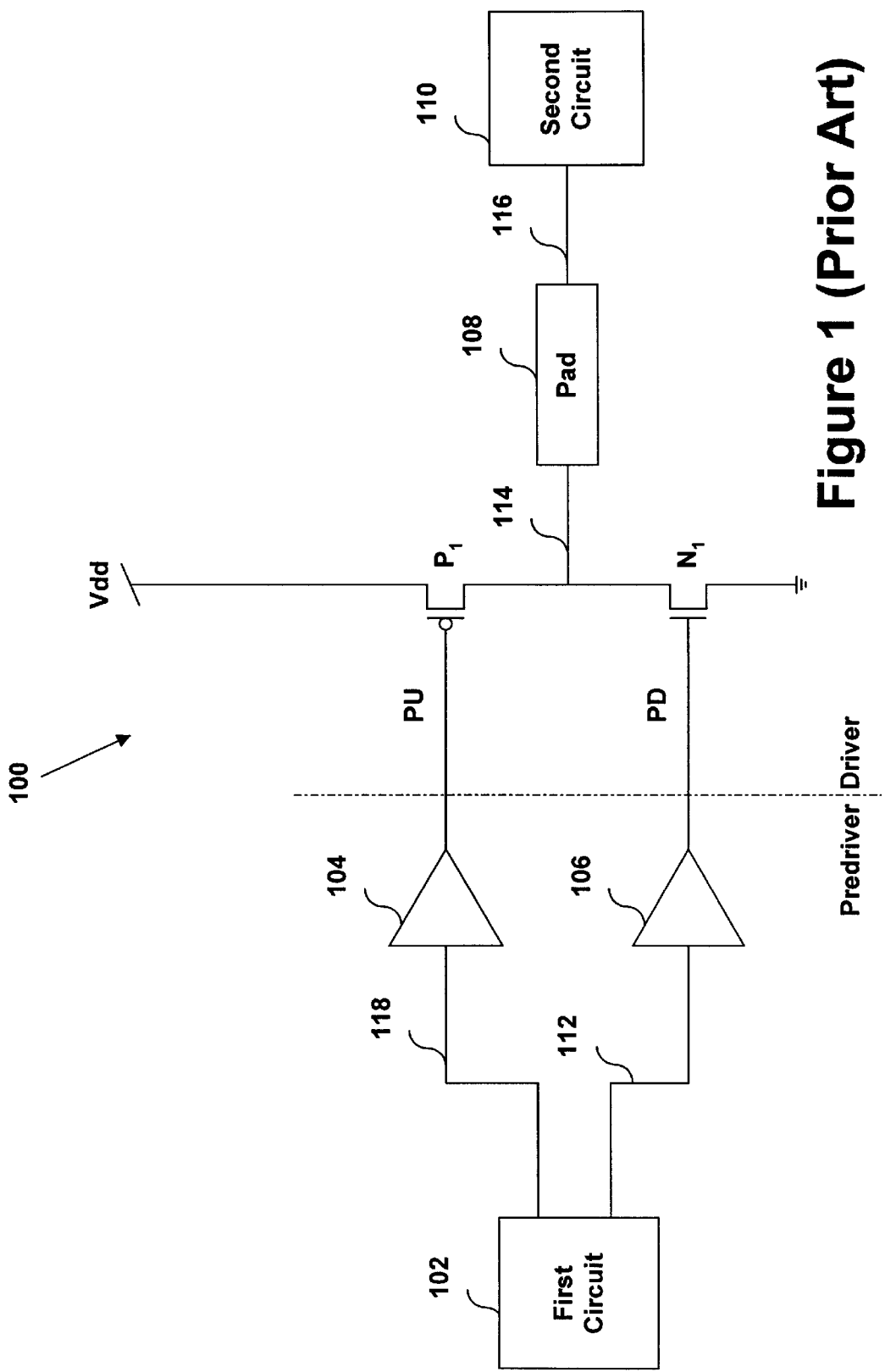
FIG. 1 is a block diagram of a prior art input/output buffer.

Referring now to FIG. 1, a block diagram of a prior art I/O buffer 100 couple between a first circuit 102 and a second circuit 110 is shown. The prior art I/O buffer 100 comprises a first and second pre-drivers 104, 106, a pull-up transistor $P_1$, a pull-down transistor $N_1$ and a pad 108. Those skilled in the art will immediately recognize that the prior art I/O buffer 100 is constructed using CMOS technolgy. The first circuit 102 is coupled to a plurality of signal lines 118, 112, to provide signals that place the prior art I/O buffer 100 in one of three states: 1) asserting a high signal or logical 1 to pad 108; 2) asserting a low signal or logical 0 to pad 108; or 3) placing the prior art I/O buffer 100 in a tristated state where neither a high or low signal is asserted. The first pre-driver 104 has an input and an output. The input of the first pre-driver 104 is coupled to the first circuit 102 by line 118 to receive a signal (low) that will turn the pull-up transistor $P_1$ ON to assert a high signal on the output pad 108. The output of the first pre-driver 104 is coupled to the gate of the pull-up transistor $P_1$. The second pre-driver 106 similarly has an input and an output, however, the input of the second pre-driver 106 is coupled to the first circuit 102 by line 112 to receive a signal (high) that will turn the pull-down transistor $N_1$ ON to assert a low signal on the output pad 108. The output of the second pre-driver 106 is coupled to the gate of the pull-down transistor $N_1$. The source of the pull-up transistor $P_1$ is coupled to the source voltage, and the drain of the pull-up transistor $P_1$ is coupled to the pad 108 and the drain of the pull-down transistors $N_1$ by signal line 114. The source of the pull-down transistor $N_1$ is coupled to ground or low voltage. Finally, the pad 108 is coupled to the second circuit 110 by line 116. Therefore, as well know in the art, the first circuit 102 applies the appropriate signals to turn 1) the pull-up transistor $P_1$ ON and the pull-down transistor $N_1$ OFF; 2) the pull-up transistor $P_1$ OFF and the pull-down transistor $N_1$ ON; or 3) the pull-up transistor $P_1$ OFF. The problem with such prior art circuits is that when the second circuit 110 applies a high voltage signal, the high voltage signal shorts the pull-up transistor $P_1$ (shorts the lower supply voltage and high supply voltage) which affects the performance consistency of the prior art I/O buffer 100, and in some cases causes the prior art I/O buffer 100 to fail.

Figure 2:
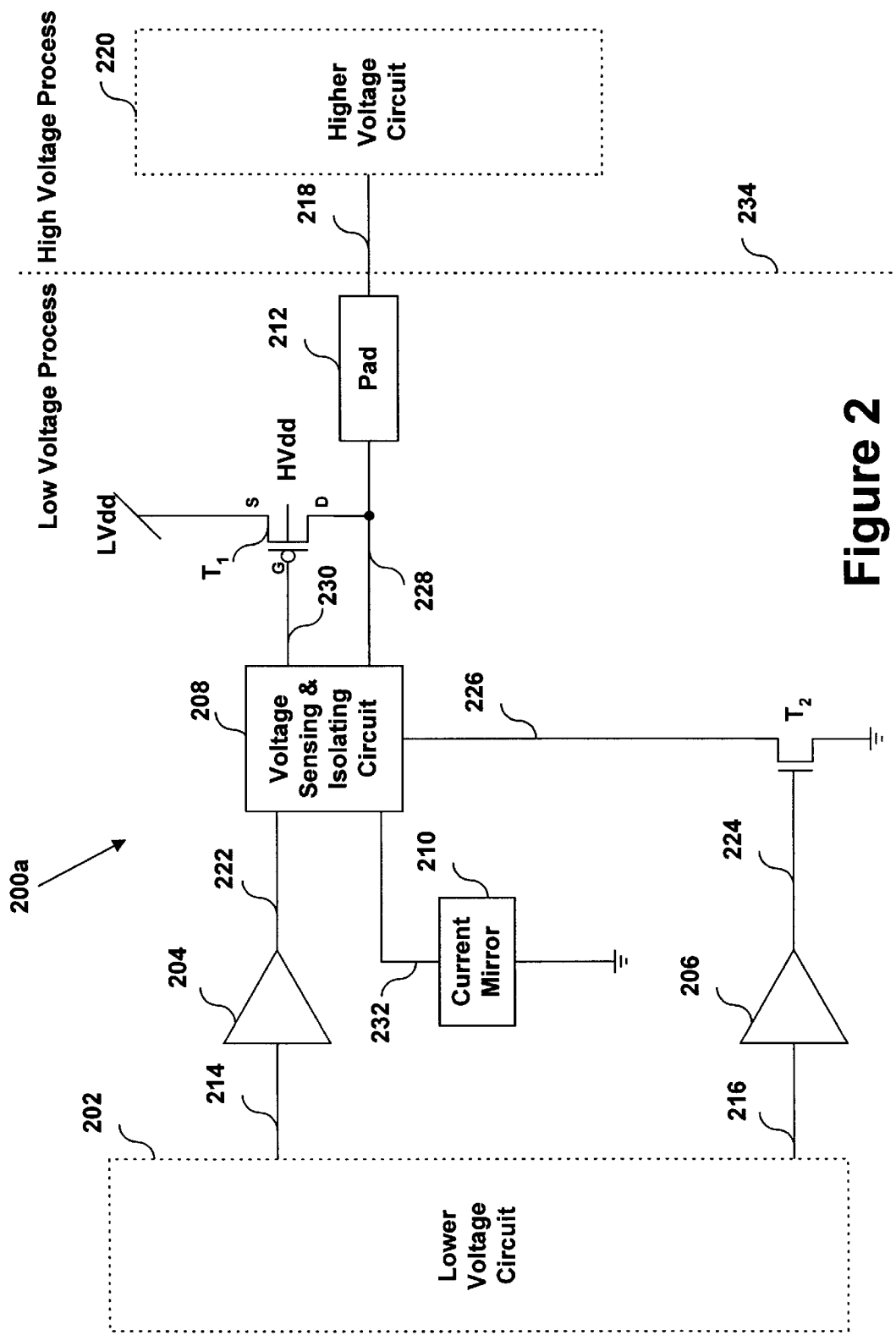
FIG. 2 is a block diagram a first and preferred embodiment of a voltage tolerant input/output buffer constructed according to the present invention.

Referring now to FIG. 2, a block diagram of a preferred embodiment of a voltage tolerant input/output buffer 200a constructed according to the present invention is shown. The voltage tolerant input/output buffer 200a is designed for use in mixed voltage circuits and is preferably coupled between a lower voltage circuit 202 operating at a lower voltage and a higher voltage circuit 220 operating at a higher voltage. The lower voltage circuit 202 is preferably circuitry such as a plurality of transistors, discrete devices and interconnections (not shown) having a first operating voltage, for example 3 volts. The lower voltage circuit 202 is connected to the voltage tolerant input/output buffer 200a by signal lines 214, 216. The higher voltage circuit 220 is also coupled to the voltage tolerant input/output buffer 200a by signal line 218 and pad 212. The higher voltage circuit 220 is preferably circuitry such as a plurality of transistors, discrete devices and interconnections (not shown), however, the higher voltage circuit 220 has a second higher operating voltage, for example 5 volts.

The voltage tolerant input/output buffer 200a has the same functionality as in the prior art in that it can be in three possible states: 1) asserting a high signal or logical 1 to pad 212; 2) asserting a low signal or logical 0 to pad 212; or 3) placing the voltage tolerant input/output buffer 200a in a tristated condition where neither a high nor a low signal is asserted. The states are achieved by applying the appropriate signals to the voltage tolerant input/output buffer 200a as shown in the TABLE I below.

TABLE I

| First Input (118,214) | Second Input (112,216) | Buffer Output |
|---|---|---|
| 0 | 0 | High (T1 ON & T2 OFF) |
| 0 | 1 | Not Valid |
| 1 | 0 | Tristate (T1 & T2 OFF) |
| 1 | 1 | Low (T1 OFF & T2 ON) |

In the first and preferred embodiment of FIG. 2, the voltage tolerant input/output buffer 200a comprises a plurality of pre-drivers 204, 206, a voltage sensing and isolating circuit 208, a current mirror 210, and a plurality of output transistors $T_1$ and $T_2$. The pre-drivers 204, 206 are coupled to receive signals from the lower voltage circuit 202. The first pre-driver 204 has an input coupled to the lower voltage circuit 202 by signal line 214. The output of the first pre-driver 204 is provided on line 222 to the voltage sensing and isolating circuit 208. Likewise, the second pre-driver 206 has an input coupled to the lower voltage circuit 202 by signal line 216. The output of the second pre-driver 206 is coupled by signal line 224 to the gate of he second output transistor $T_2$. The signals applied to signal lines 222 and 224 are used to control the activation of the output transistors $T_1$ and $T_2$, respectively, thus, the states of the voltage tolerant input/output buffer 200a.

The first transistor $T_1$ is preferably a p-type FET, and has its gate coupled by signal line 230 to the voltage sensing and isolating circuit 208 to receive signals from the lower voltage circuit 202 via the pre-driver 204. The source of transistor $T_1$ is coupled to the supply voltage of the lower voltage circuit (LVdd), and the drain of transistor $T_1$ is coupled to pad 212 by line 228 to send and receive signals to and from the higher voltage circuit 220. The transistor $T_1$ is similar to other transistors in the lower voltage circuit 202 with a very notable distinction, the well pin of transistor $T_1$ is coupled to the supply voltage of the higher voltage circuit (HVdd). According to the present invention, the well should be at a higher of voltage than the drain or source. In the present invention, to operate in the mixed voltages situation the voltage HVdd is applied to the drain and gate. Therefore, the well must be at least HVdd in order to prevent current flow from the drain to the well.

The second transistor $T_2$ is preferably an n-type FET, and has its gate coupled by signal line 224 to receive signals from the lower voltage circuit 202 via the pre-driver 206. The source of the second transistor $T_2$ is preferably coupled to ground, and the drain of the second transistor $T_2$ is coupled by signal line 226 to the voltage sensing and isolating circuit 208. The second transistor $T_2$ is activated by the application of a high signal to its gate, which pulls line 226 low. Thus, if a high signal is provided to the second pre-driver 206, the buffer will cause its output on pad 212 to be low or logical 0.

The voltage tolerant input/output buffer 200a includes the voltage sensing and isolating circuit 208 that acts with the current mirror 210 to sink a portion of the current applied when the higher voltage circuit 220 applies a high voltage to the pad 212. The current mirror 210 is provided to draw current and make sure the voltage sensing and isolating circuit 208 discharges any voltages such that the line 230 is not allowed to float. The voltage sensing and isolating circuit 208 is coupled to signal line 228 to receive current, thereby supporting and preventing the failure of the first output transistor $T_1$. The voltage sensing and isolating circuit 208 is also coupled by signal line 226 to the source of the second output transistor $T_2$ and by signal line 230 to the gate of the first output transistor $T_1$. The voltage sensing and isolating circuit 208 is still further coupled to the current source 210 by line 232. The current source 210 in turn is coupled to ground. The final input of the voltage sensing and isolating circuit 208 is coupled to line 222 to receive the output of the first pre-driver 204. The use of the voltage sensing and isolating circuit 208 is particularly advantageous because it prevents application of the higher source voltage from affecting the operation of the input/output buffer 200a. In particular, when appropriate signals are applied to activate either transistor $T_1$ or $T_2$ to an ON state, the voltage sensing and isolating circuit 208 merely passes the signals to the gate of the first output transistor $T_1$ or allows normal operation of $T_2$. However, if the higher voltage circuit 220 applies a high voltage to the pad 212, the voltage sensing and isolating circuit 208 effectively prevents the applied voltage from reaching line 222 or 226, and equalizes the voltage difference between the gate and drain of the first output transistor $T_1$ to prevent device failure. Together the current mirror 210 and the voltage sensing and isolating circuit 208 remove stress applied by a transition from zero to the high supply voltage of the higher voltage circuit 220 on transistor $T_1$. In particular, the present invention prevents any voltage differentials between the gate and drain from being greater than 4 V for transistor $T_1$ and $T_2$, and thereby prevent failure of these transistors. This is particularly advantageous because transistors constructed using a 3 V process are able to withstand voltages up to 4 V (1 V above their supply and typical operating voltage) without impacting or affecting their performance. Therefore, the present invention precludes damaged to the transistors by ensuring that no voltages greater than 4 V will be applied to the transistors.

Furthermore, as shown in FIG. 2, the present invention is particularly advantageous because it does not require any extra processes to manufacture the input/output buffer 200a. As illustrated by the dashed line 234, all the components to the left of dashed line 234 are preferably manufactured using a single process such as a 3 V process and the remaining circuitry to the right of the dashed line 234 can be manufactured by another higher voltage process such as a 5 V process. This is particularly advantageous because no special semiconductor processing is required to provide the interface for the circuits portions despite the fact that they have different operating voltages.

Figure 3:
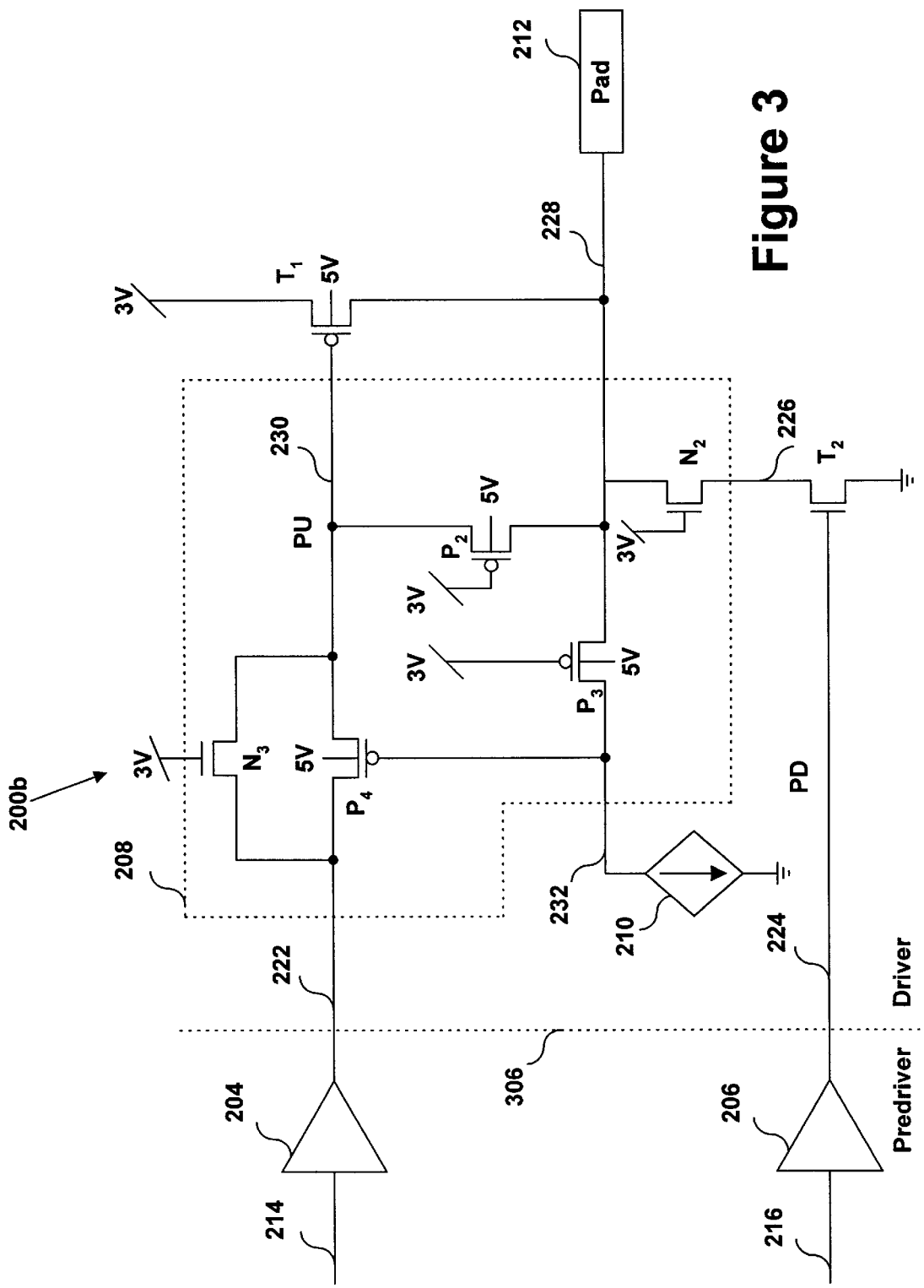
FIG. 3 is a block diagram of a second embodiment of the voltage tolerant input/output buffer constructed according to the present invention.

Referring now to FIG. 3, one embodiment for the voltage sensing and isolating circuit 208 and the current mirror 210 is shown in more detail. For convenience and ease of understanding, like reference numerals have been used for like parts where possible. Furthermore, the detailed embodiment of the voltage sensing and isolating circuit 208 and voltage tolerant input/output buffer 200 are described below with the operating voltage of the lower voltage circuit 202 as 3 V, and the operating voltage of the higher voltage circuit 220 as 5 V. Nonetheless, those skilled in the art will realize how the present invention can be used in a variety of other mixed voltage scenarios.

The embodiment of the voltage tolerant input/output buffer 200b shown in FIG. 3 preferably comprises a current source as the current mirror 210 and a plurality of transistors $P_2$, $P_3$, $P_4$, $N_2$ and $N_3$ as the voltage sensing and isolating circuit 208. The couplings to the first and second pre-drivers 204, 206, and first and second output transistors $T_1$, $T_2$ are the same as in FIG. 2, and shown here for clarity of understanding. Each of the transistors $P_2$, $P_3$, $P_4$, $T_1$ is preferably a p-type FET, and has its respective the well pin coupled to the 5 V supply voltage. Again this embodiment, transistor $T_1$ serves as the output transistor has its source coupled to the 3 V supply voltage, and its drain connected to pad 212 by signal line 228. The gate of transistor $T_1$ forms a first node PU, and is coupled by signal line 230 to the source of transistor $P_2$ and the source of transistor $P_4$. The drain of transistor $P_4$ is coupled to signal line 222 to connect the voltage sensing and isolating circuit 208 to the lower voltage circuit 202 via the first pre-driver 204. Transistor $P_2$ has its gate coupled to the 3 V supply and its drain coupled to pad 212 by signal line 228. Finally, the last PMOS transistor, transistor $P_3$ couples the pad 20 to the current source 210. The drain of transistor $P_3$ is coupled to pad 212 by line 228, the gate is coupled to the 3 V supply; and the source of transistor $P_3$ is coupled to the current source 210. The source of transistor $P_3$ forms a another node, and is also coupled to the gate of transistor $P_4$.

The embodiment of the voltage tolerant input/output buffer 200b shown in FIG. 3 also includes the two NMOS transistors $N_2$ and $N_3$, as noted above. A first transistors $N_2$ has its gate coupled to 3 V, its drain coupled by line 228 to the pad 212, and its source coupled to the drain of transistor $T_2$. It should be noted that $T_2$ is preferably also an NMOS transistor. The two NMOS transistors $N_2$ and $T_2$ are coupled serially such that the application of 5 V to the pad 212 does not damage either transistor $N_2$ or $T_2$, and more specifically to remove stress from transistor $T_2$ if it were present alone. Since the gate of transistor $N_2$ is coupled to 3 V, the source of transistor $N_2$ can at most pull the node 226 to 3 V when 5 V is applied to pad 212 by an outside source. By connecting transistor $N_2$ in series with transistor $T_2$, the voltage at the intermediate node 226 (the source of transistor $N_2$) is advantageously reduced to less than 3 V. Thus, at most there will be a 3 V difference between gate, source or drain of the transistor $T_2$, protecting transistor $T_2$ and transistor $N_2$ from damage due to the application of 5 V on pad 212. A final NMOS transistor $N_3$ is provided. The transistor $N_3$ has its gate coupled to 3 V, its source coupled to line 230, and its drain coupled to the line 222. The transistor $N_3$ is coupled in parallel with transistor $P_4$.

The operation of the embodiment of the voltage tolerant input/output buffer 200*b* shown in FIG. 3 will now be described in terms of the input/output buffer 200*b* transitioning into each of the states described above in the Table I.

First, the input/output buffer 200*b* asserts a high voltage on the output line 228 in response to application of a low signal from the lower voltage circuit 202 on line 214. In particular, the pre-driver 204 asserts a low voltage signal on line 222 in response to the low signal on line 214. In turn, the transistor $N_3$ and $P_4$ are activated or turned ON to pull node PU to a low signal state. The application of this low signal on the gate of transistor $T_1$ caused it to turn ON and pull up line 228 to the high voltage of 3 V, thereby providing a high or 3 V signal on the output pad 212.

Second, the input/output buffer 200*b* asserts a low voltage on the output line 228 in response to application of a high signal from the lower voltage circuit 202 on line 216. More specifically, the application of a high signal passed through the pre-driver 206 to the gate of transistor $T_2$ via line 224. The high signal on the gate of transistor $T_2$ cause the transistor to activate or turn ON pulling the drain of transistor $T_2$ to a low voltage level or ground. This in turn creates a difference between the gate and source of the transistor $N_2$ causing it to turn ON and pull the drain of transistor $N_2$, thereby providing a low voltage signal on line 228, and thus the pad 212.

Third and finally, in the tristated condition, the input/output buffer 200*b* turns OFF transistors $T_2$, $N_2$, and $T_1$, by applying a high signal on line 214 and a low signal on line 216. The application of high signal on the gate of transistors $T_1$, and the low signal on the gate of transistors $T_2$, is similar as has been described above. When the transistors $T_2$, $N_2$, and $T_1$, are in the OFF state, the line 228 and the pad 212 are allowed to float, and can be used by the high voltage circuit 220 to apply high or low voltages. The advantages of the present invention are best shown when the circuit is in the tristated condition, and the high voltage circuit 220 asserts a high voltage on the pad 212 which is in turn applied to line 228. If the high voltage circuit 220 asserts a high signal at a 3 V level, the present invention provides extra protection to protect the normal operation of the buffer 200*b*. However, in the mixed voltage scenarios, the high voltage circuit 220 can also assert a high signal at a 5 V level. In such a case, the buffer 200*a* of the present invention will operate unaffected despite the high signal rising to a 5 V level. In particular and referring to FIG. 3, in the tristated mode, the line 224 or node PD is pulled to 0 V and the node PU is pulled to 3 V. Once the voltage on the pad 212 and line 228 begins rising to 5 V, transistor $P_3$ turns ON to drive the node formed by signal line 232 to begin rising going to 5 V. The increased voltage on line 232 causes the transistor $P_4$ to turn OFF, and thereby prevents any current through transistors $P_4$ and $P_2$ from passing to signal line 222. Once transistor $P_4$ is turned OFF, node PU will begin to rise to 5 V because transistor $P_2$ is in an ON state because of the 5 V level applied to its drain. The 5 V level on node PU at the gate of transistor $T_1$ causes transistor $T_1$ to turn OFF with a 5 V voltage at both the gate and the drain of transistor $T_1$. Turning OFF $T_1$ does not cause a short between LVdd (3 V) and HVdd (5 V) because both the gate and drain are at the HVdd (5 V) level. Furthermore, since the predrivers 204, 206 are coupled to the LVdd (3 V), they are advantageously isolated from the HVdd (5 V) by transistors $P_4$ and $N_3$ and remain fully protected from shorting which would occur if the HVdd (5 V) were applied on line 222 or 224. This is particularly advantageous because no stress is placed on transistor $T_1$ by virtue of the application of the higher operating voltage to the pad 212. Therefore, the present invention is basically able to provide gate to drain voltage less than 3 V or the operating voltage of the lower voltage circuit which are certain to be within the acceptable tolerances of the devices.

As the external voltage applied to pad 212 goes from 5 V to around 3 V or even to 0 V, the node 232 is discharged through the current source 210, and thus turns ON transistor $P_4$. As $P_4$ is turned ON, node 230 or PU is again pulled back to a known voltage of 3 V, and thus transistor $T_1$ is still turned OFF. If not for this mechanism, node 232 would be high, $P_4$ would be turned OFF and node 230 or PU would be floating. This could lead to a disastrous situation where there is a direct connection from LVdd (3 V) to the pad 212 through transistor $T_1$.

While the present invention has been described with reference to certain preferred embodiments, those skilled in the art will recognize that various modifications may be provided. These and other variations upon, and modifications to the preferred embodiment are provided for by the present invention, which is limited only by the following claims.

What is claimed is:

1. A voltage tolerant input/output buffer for interfacing circuitry operating at a first operating voltage level and circuitry operating at a second operating voltage level the voltage tolerant input/output buffer comprising:

an output transistor having a gate, a source, a drain and a well, the source of the output transistor coupled to the first operating voltage level, and the well of the output transistor coupled to the second operating voltage level:

a voltage sensing and isolating circuit coupled to the gate and the drain of the output transistor and coupled to receive signals from the circuitry operating at the first voltage level, the voltage sensing and isolating circuit for preventing stress on the output transistor, the voltage sensing and isolating circuit further comprising a first buffering transistor having a gate, a source, a drain, and a well, the drain of the first buffering transistor coupled to the drain of the output transistor, the source of the first buffering transistor coupled to a current mirror, the gate of the first buffering transistor coupled to the first operating voltage level, and the well of the first buffering transistor coupled to the second operating voltage level to prevent leakage current between the drain and well of the first buffering transistor, and a second buffering transistor having a gate, a source and a drain, the second buffering transistor coupled between the gate and drain of the output transistor with the gate of the second buffering transistor coupled to the first operating voltage level, the first and second buffering transistor stabilizing the voltage at the gate of the output transistor at the second operating voltage level in response to assertion of the second operating voltage level on the drain of the output transistor; and the current mirror coupled to ground and to the voltage sensing and isolating circuit, for maintaining an OFF state of the output transistor.

2. The voltage tolerant input/output buffer of claim 1, wherein the second buffering transistor has a well coupled to the second operating voltage level to prevent leakage current between the drain and well of the second buffering transistor.

3. A voltage tolerant input/output buffer for interfacing circuitry operating at a first operating voltage level and circuitry operating at a second operating voltage level, the voltage tolerant input/output buffer comprising:

an output transistor having a gate, a source, a drain and a well, the source of the output transistor coupled to the first operating voltage level, and the well of the output transistor coupled to the second operating voltage level;

a voltage sensing and isolating circuit coupled to the gate and the drain of the output transistor and coupled to receive signals from the circuitry operating at the first voltage level, the voltage sensing and isolating circuit for preventing stress on the output transistor, the voltage sensing and isolating circuit further comprising a first cutoff transistor having a gate, a source, a drain and a well, the first cutoff transistor coupled to the gate of the output transistor and to receive signals from the circuitry operating at the first operating voltage level, the gate of the first cutoff transistor coupled to a current mirror for maintaining an OFF state of the output transistor, and the well of the first cutoff transistor coupled to the second operating voltage level to prevent leakage current between the drain and well of the first cutoff transistor, and a second cutoff transistor having a gate, a source and a drain, the second cutoff transistor coupled to the gate of the output transistor and to receive signals from the circuitry operating at the first operating voltage level, the gate of the second cutoff transistor coupled to the first operating voltage level; and the current mirror coupled to ground and to the voltage sensing and isolating circuit, for maintaining an OFF state of the output transistor.

4. The voltage tolerant input/output buffer of claim 3, wherein the first cutoff transistor is a PMOS transistor and the second cutoff transistor is an NMOS transistor.

5. The voltage tolerant input/output buffer of claim 3, wherein the second cutoff transistor has a well coupled to the second operating voltage level to prevent leakage current between the drain and well of the second cutoff transistor.

\* \* \* \* \*